United States Patent
An et al.

(10) Patent No.: US 6,265,264 B1
(45) Date of Patent: Jul. 24, 2001

(54) METHOD OF DOPING AND HSG SURFACE OF A CAPACITOR ELECTRODE WITH $PH_3$ UNDER A LOW TEMPERATURE/HIGH PRESSURE PROCESSING CONDITION

(75) Inventors: Joong-Il An, Suwon; Kyung-Ho Hyun, Seoul; Byung-Su Koo; Sun-Woo Kwak, both of Suwon, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/548,013

(22) Filed: Apr. 12, 2000

(30) Foreign Application Priority Data

Oct. 5, 1999 (KR) .................................................. 99-42800

(51) Int. Cl.[7] .............................................. H01L 21/8242
(52) U.S. Cl. ........................ 438/255; 438/238; 438/381; 438/398; 438/964
(58) Field of Search ..................................... 438/238, 239, 438/398, 255, 964, 381

(56) References Cited

U.S. PATENT DOCUMENTS 5,989,973 * 11/1999 Zahurak et al. ..................... 438/398
6,069,053 * 5/2000 Ping et al. ............................ 438/398
6,143,605 * 11/2000 Lou ....................................... 438/255

FOREIGN PATENT DOCUMENTS

553791-A1 * 8/1993 (EP).
80142-A1 * 10/1997 (EP).
874393 * 10/1998 (EP).

* cited by examiner

Primary Examiner—Trung Dang
(74) Attorney, Agent, or Firm—Jones Volentine, PLLC

(57) ABSTRACT

A method of fabricating a capacitor of a semiconductor device maximizes the imurity density of HSG formed at a surface of an electrode of the capacitor and thereby improves capacitance and breakdown voltage characteristics of a DRAM device incorporating the same. The method includes forming an inter-level insulating layer having a buried contact hole which exposes the underlying semiconductor substrate, forming an amorphous polysilicon layer doped with a low density of a p-type impurity on the resultant structure, selectively etching the polysilicon layer with a mask having a pattern configured to form a bottom electrode over a predetermined portion of the inter-level insulating layer which includes the contact hole, causing HSG to grow on the exposed surface of the bottom electrode, and doping $PH_3$ into the HSG under a "low temperature/ high pressure" process condition.

3 Claims, 7 Drawing Sheets

METHOD OF DOPING AND HSG SURFACE OF A CAPACITOR ELECTRODE WITH PH₃ UNDER A LOW TEMPERATURE/HIGH PRESSURE PROCESSING CONDITION

BACKGROUND OF THE INVENTION

1. Field of the Invention

The present invention relates to a method of fabricating a semiconductor device. More particularly, the present invention relates to a method of fabricating a capacitor of a DRAM of a semiconductor device using hemispherical grains (HSG).

2. Description of the Related Art

As semiconductor devices become more highly integrated, the chips of such devices have become smaller. At the same time, a great effort has been made to increase the memory capacity of a small chip by increasing the capacitance of a capacitor of the chip without increasing the area occupied on the chip by the capacitor. Accordingly, an HSG forming process is presently used in the fabricating of semiconductor devices to maximize the surface area of a capacitor of a DRAM device.

However, the HSG process is problematic in that the HSG layer must be made by seeding undoped silicon, whereupon the depletion capacitance of the capacitor is reduced due to the low density of a bottom electrode and the total capacitance of the DRAM device is thereby reduced.

In order to solve this problem, recently, a method of fabricating a high density bottom electrode has been developed. FIG. 1 illustrates such a method as applied to the fabricating of a conventional DRAM capacitor, and FIG. 2 illustrates the structure of a bottom electrode of a DRAM capacitor fabricated according to the procedure illustrated in FIG. 1. With reference to the drawings, the conventional method essentially involves the following six steps.

In the first step 10, an inter-level insulating layer 102 is formed on a semiconductor substrate 100.

In the second step 20, a mask is used to facilitate an etching of the inter-level insulating layer 102 to expose a predetermined portion of the surface of the semiconductor substrate 100, thereby forming a buried contact hole (h) in the inter-level insulating layer 102.

In the third step 30, an amorphous polysilicon layer is formed over the exposed surface of the substrate 100, thereby filling the contact hole (h) and covering the inter-level insulating layer 102. The amorphous silicon layer is doped with a high density of a p-type impurity which allows the material to serve as an electrode material. Specifically, the doping density of the p-type impurity is approximately $5 \times 10^{20} \sim 6 \times 10^{20}$ atoms/cm³. Then, a mask is used to facilitate a selective etching of the polysilicon layer. As a result, a polysilicon bottom electrode is formed at a predetermined portion of the inter-level insulating layer 102 including within the contact hole (h).

In the fourth step 40, HSG 106 is grown only at the exposed surface of the bottom electrode 104 in order to increase the effective surface area of the capacitor.

In the fifth step 50, a cleaning process is performed for eliminating all of the particles (or contaminants) remaining on the resultant structure.

In the sixth step 60, in order to enhance the surface density, PH₃ is doped into the HSG 106 under a "high temperature/low pressure" operational condition for 180 minutes. Such a condition refers to a high temperature of over 700° C., and a low pressure of 2~3 Torr. This step completes the formation of the bottom electrode.

However, if a bottom electrode of a DRAM capacitor is formed using the above-described fabricating method, the following problems occur.

Under the "high temperature/low pressure" condition established in the process of doping PH₃ into the HSG, the grains will compact and the HSG will deform into a shape in which the top thereof is rather broad. FIG. 3 illustrates the HSG so deformed at the portion of the bottom electrode indicated as part I in FIG. 2. In FIG. 3, reference symbols (a) and (b) respectively indicate shapes of the HSG before and after the PH₃ doping process.

If the HSG is deformed in this way in the process of doping the HSG with PH₃, the p-type ions are not completely immersed. Some of the impurity ions exhibits outgassing and are bounced off of the HSG, or even p-type ions that were successfully introduced in the bottom electrode 104 material become so heated that they are excited out of the HSG. Therefore, the doping density of the HSG can not be increased to a maximum extent.

While a DRAM comprising a capacitor having a bottom electrode fabricated in this way is operated, the breakdown voltage continuously increases, but the capacitance decreases due to the aforementioned problem. There is thus an urgent demand for solving this problem.

SUMMARY OF THE INVENTION

Therefore, it is an object of the present invention to provide a method of fabricating a capacitor of a DRAM device, which maximizes the capacitance characteristic of the DRAM device.

To achieve this object, the present invention provides a method of fabricating a bottom electrode of a capacitor of a semiconductor device, in which HSG at the surface of the electrode is doped with PH₃ under a "low temperature/high pressure" process condition to thereby prevent the HSG from changing shape and thereby maximize the dopant density of the HSG which, in turn, improves the capacitance and breakdown voltage characteristics of a DRAM device incorporating the capacitor.

The HSG is grown on a polysilicon layer doped with a p-type impurity preferably at a doping density of approximately $0.9 \times 10^{20} \sim 1.1 \times 10^{20}$ atoms/cm³. The low temperature refers to a temperature below 700° C., and the high pressure refers to a pressure greater than 10 Torr. The PH₃ doping process is preferably performed within a short period of time, i.e., under 60 minutes.

BRIEF DESCRIPTION OF THE DRAWINGS

These and other objects, features and advantages of the invention will become more apparent from the following detailed description of the preferred embodiment made with reference to the accompanying drawings, of which.

DETAILED DESCRIPTION OF THE PREFERRED EMBODIMENT

Figure 1:
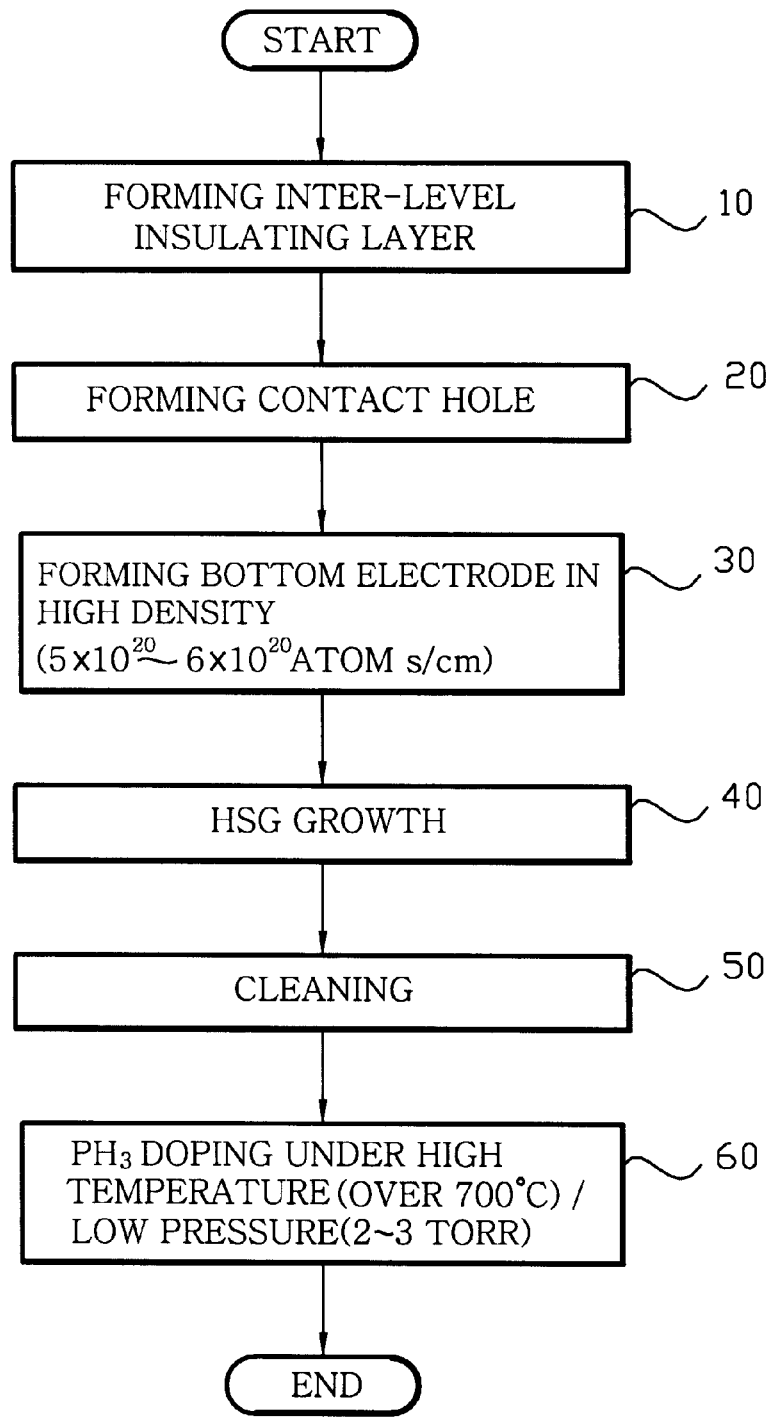
FIG. 1 is a block diagram of a conventional method of fabricating a DRAM capacitor.
Figure 2:
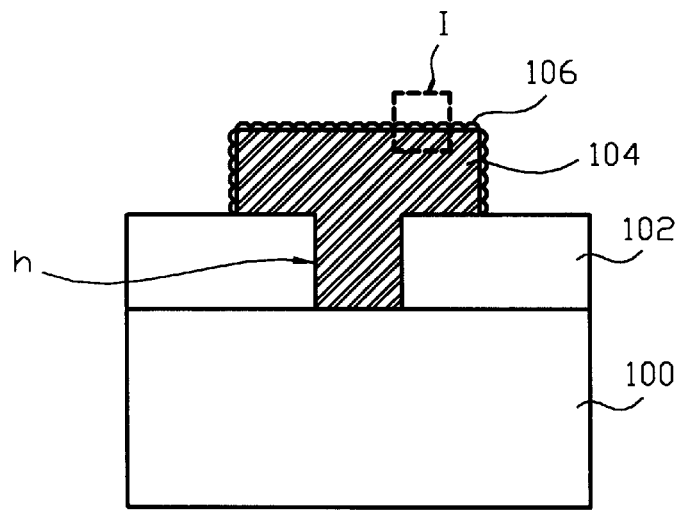
FIG. 2 is a cross-sectional view of a capacitor of a DRAM fabricated according to the procedure shown in FIG. 1.
Figure 3:
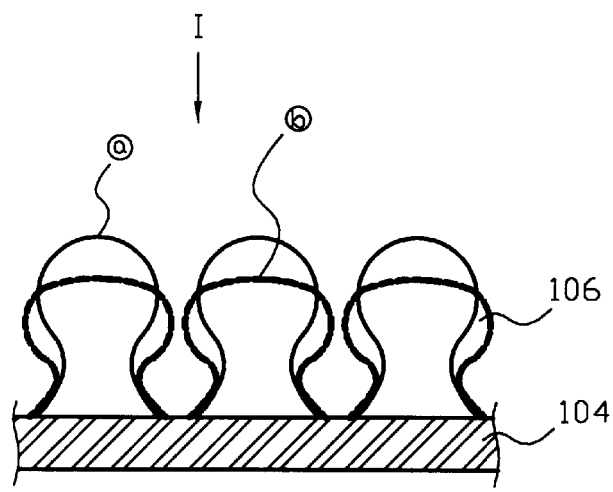
FIG. 3 is an enlarged view of part I of the capacitor shown in FIG. 2.
Figure 4:
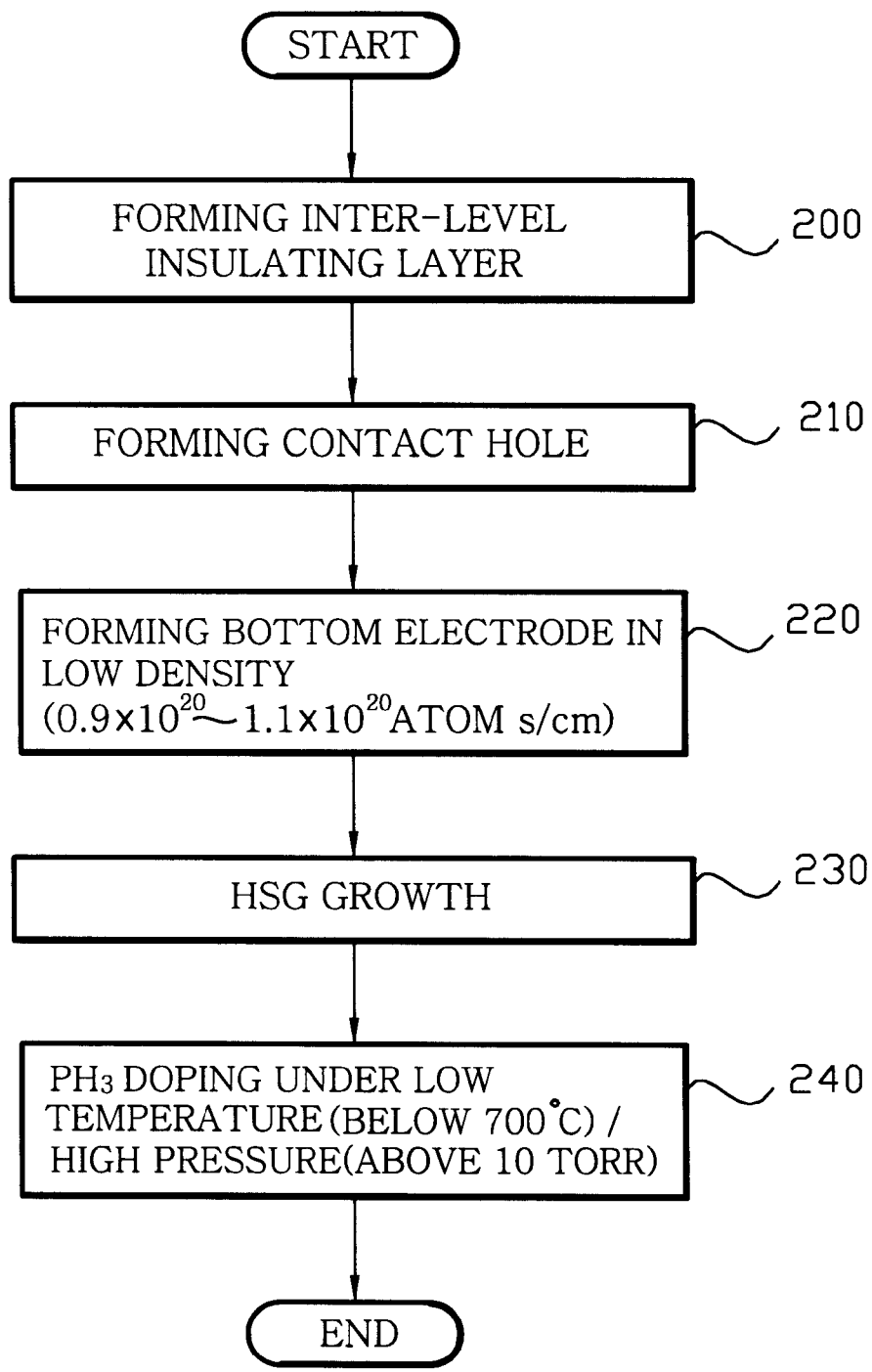
FIG. 4 is a block diagram of a method of fabricating a DRAM capacitor in accordance with the present invention.
Figure 5:
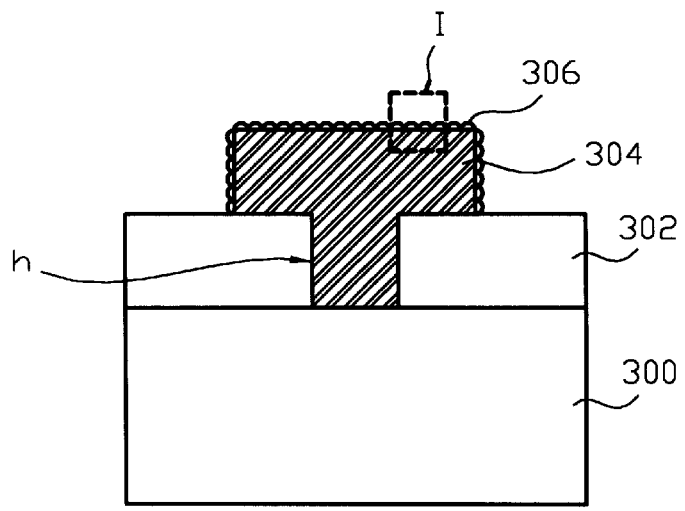
FIG. 5 is a cross-sectional view of a capacitor of a DRAM fabricated according to the method shown in FIG. 4.

The five general steps of the present invention will now be described with reference to FIGS. 4 and 5. Steps identical to those in the prior art will only be mentioned briefly, and a detailed description thereof will be omitted for the sake of brevity.

Referring now to these figures, in the first step 200, an inter-level insulating layer 302 comprising an oxide layer is formed on a semiconductor substrate 300.

In the second step 210, a mask is used to facilitate a selective etching of the inter-level insulating layer 303, thereby forming a buried contact hole (h) in the inter-level insulating layer 302 which exposes a predetermined portion of the surface of the semiconductor substrate 300.

In the third step 220, an amorphous polysilicon layer is formed over the resultant structure so as to fill in the contact hole (h). The amorphous polysilicon layer has a low density of a p-type impurity and thus serves as an electrode layer. In this case, the doping density of the p-type impurity is approximately $0.9 \times 10^{20} \sim 1.1 \times 10^{20}$ atoms/cm$^3$. Then, a mask is used to facilitate a selective etching of the polysilicon layer. As a result, a polysilicon bottom electrode 304 is formed at a predetermined portion of the inter-level insulating layer 302, which portion includes the contact hole (h).

In the fourth step 230, HSG 306 is grown only at an exposed surface of the bottom electrode 304 in order to enhance the capacitance of the capacitor by increasing the surface area of the bottom electrode 304.

It the fifth step 240, in order to improve the impurity density of the HSG 106, PH$_3$ is doped into the HSG 306 under a "low temperature/high pressure" condition for a short period of time, i.e., less than 60 minutes. This condition refers to a low temperature of less than 700° C., and a high pressure of at least 10 Torr. This process completes the formation of a bottom electrode.

Subsequently, the remaining portion of the capacitor is fabricated over this structure, e.g., a dielectric layer and an upper electrode are sequentially formed over the exposed surface of the low density bottom electrode 304 having the HSG 306.

Figure 6:
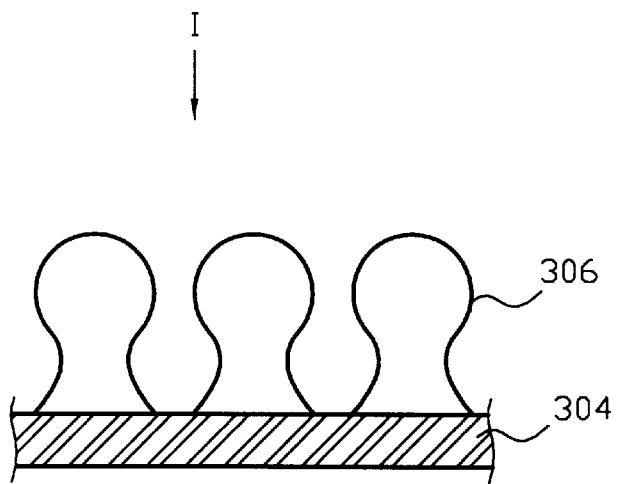
FIG. 6 is an enlarged view of part I of the capacitor shown in FIG. 5.

FIG. 6 shows a portion of the exposed surface of the bottom electrode of the DRAM capacitor fabricated in accordance with the method described above.

As can be seen from this figure, the HSG retains its shape during the doping of the PH$_3$ impurity. Therefore, the method of the present invention increases the doping density at the surface, i.e., of the HSG, whereby a DRAM incorporating a capacitor made in this way will exhibit a relatively high capacitance.

Figure 7:
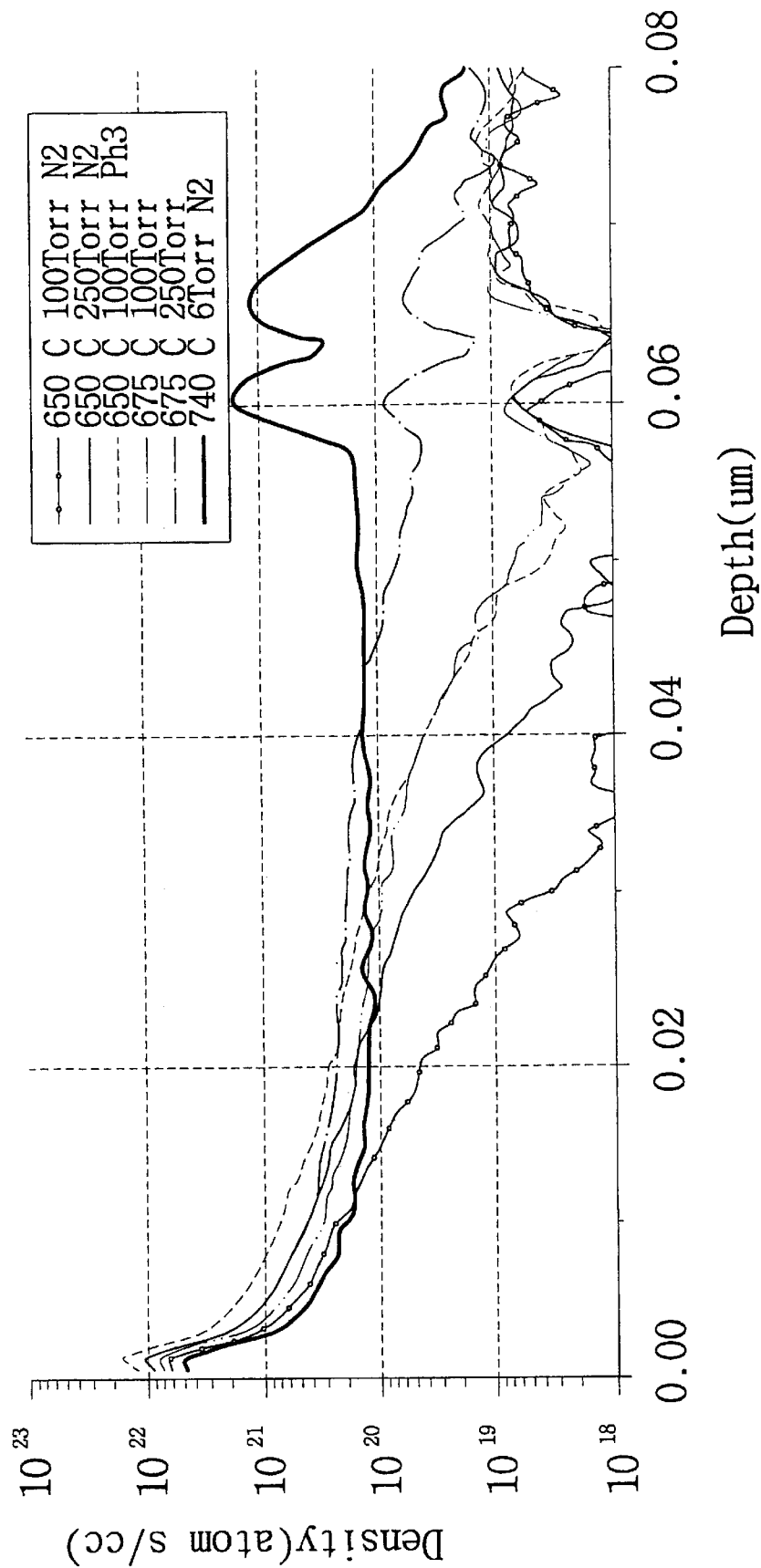
FIG. 7 is a characteristic graph illustrating changes in the density of the bottom electrode of the capacitor of the DRAM shown in FIG. 5.

This advantage was confirmed by results illustrated in the graph of FIG. 7. FIG. 7 illustrates changes in the surface density of a bottom electrode made in accordance with the present invention. As shown in this figure, when the doping is carried out under a "high temperature and low pressure" condition, the bottom electrode possesses a predetermined doping density from the surface of the bottom electrode, including the HSG, to the layer underlying the bottom electrode. However, when the doping is carried out under a "low temperature and high pressure" condition, a high density is maintained from the surface of the bottom electrode through an intermediate portion of the bottom electrode, although the density is lower from the intermediate portion to the underlying layer.

In other words, if the capacitor is formed under the "low temperature/high pressure" condition, the bottom electrode has a low density of dopant but the HSG at the surface of the bottom electrode has a high density of dopant.

In fact, when the doping of the bottom electrode with an impurity of PH$_3$ is carried out at a low temperature of less than 700° C. and a high pressure of greater than 10 Torr, for a time of less than 60 minutes, and a cleaning process, such as that performed in the prior art, is omitted, a most significant improvement has been made in the capacitance and breakdown voltage characteristics of a capacitor of an over 64MD semiconductor device.

The capacitance and breakdown voltage characteristics were determined in tests in which operational parameters, such as doping temperature (1), doping pressure (2), doping time (3), inclusion or exclusion of a pretreatment process (cleaning process) (4), were studied.

The results of the tests will be described below.

Figure 8:
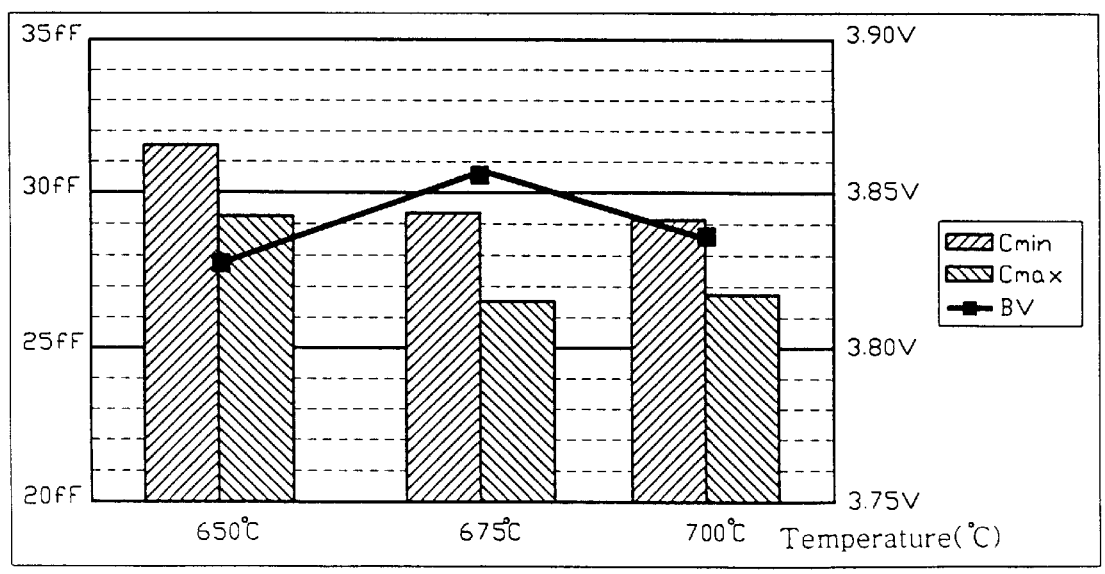
FIG. 8 is a characteristic graph illustrating changes in capacitance and breakdown voltage characteristics in accordance with doping temperature.

FIG. 8 is graph illustrating changes in capacitance and breakdown voltage characteristic in accordance with doping temperature (1). In this graph, reference symbols Cm, Cmax and BV respectively designate minimum capacitance, maximum capacitance and breakdown voltage. As shown in the graph of FIG. 8, there is an inflection point at a particular temperature. It can be confirmed that there is no more improvement in capacitance and breakdown voltage over the particular temperature.

Figure 9:
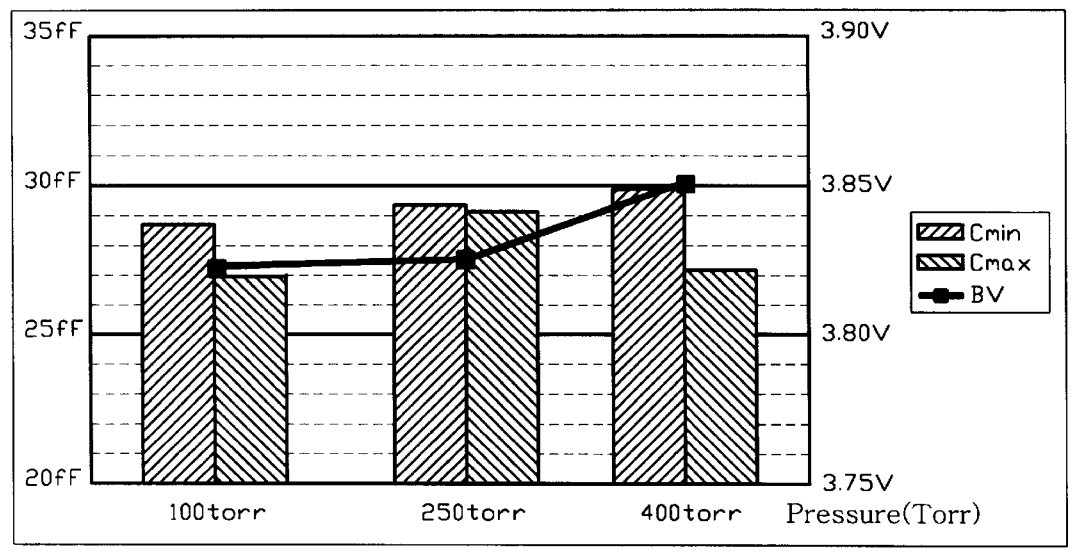
FIG. 9 is a characteristic graph illustrating changes in capacitance and breakdown voltage characteristics in accordance with doping pressure.

Next, FIG. 9 is a graph illustrating changes in capacitance and breakdown voltage characteristics in accordance with doping pressure. As shown by the graph of FIG. 9, the higher the pressure, the greater the capacitance and breakdown voltage characteristics become (2).

Figure 10:
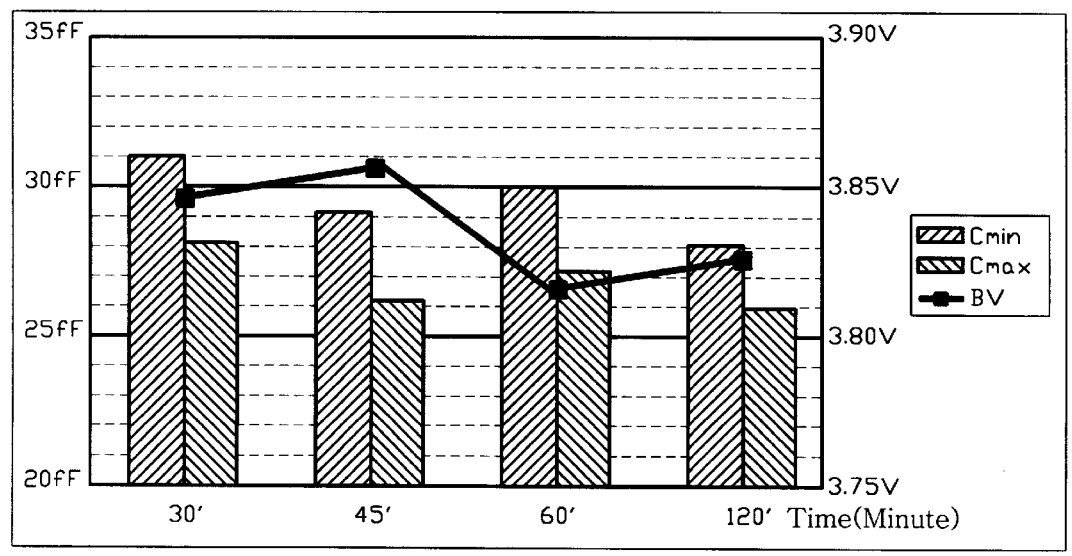
FIG. 10 is a characteristic graph illustrating changes in capacitance and breakdown voltage characteristics in accordance with doping time.

FIG. 10 is a graph illustrating changes in capacitance and breakdown voltage characteristics in accordance with doping time. As shown by the graph of FIG. 10, the longer the doping time, the worse the capacitance characteristic becomes (3).

Finally, tests carried out also confirm that a higher capacitance characteristic can be obtained when a cleaning process is skipped before the process of doping the electrode with PH$_3$ (4).

According to the aforementioned test results, if the process of doping the HSG of the capacitor electrode with PH$_3$ is performed in accordance with the present invention, the capacitance and breakdown characteristics of a DRAM device employing the capacitor are improved. An improved breakdown voltage characteristic also improves the refresh operation processing characteristic. Furthermore, the present invention also offers an additional advantage in terms of enhancing productivity in the manufacturing of DRAM devices. Specifically, the operational parameters of the present invention, such as the omission of a cleaning process and/or the comparatively short duration of the PH$_3$ impurity doping process, saves time in the overall process of manufacturing the DRAM devices.

In summary, the present invention offers an improvement in the method of fabricating a capacitor of a DRAM device in which the bottom electrode is made of an amorphous silicon doped with a low density of a P type impurity and the surface density is increased by doping HSG with $PH_3$. By performing the doping process under a "low temperature and high pressure" operational condition for less than 60 minutes, a change in the shape of the HSG during the $PH_3$ doping process is prevented whereby the doping density of the HSG remains high. This in turn leads to an improvement in capacitance and breakdown characteristics of the DRAM device employing the capacitor.

What is claimed is:

1. A method of fabricating an electrode of a capacitor of a semiconductor device, said method comprising:

forming an inter-level insulating layer having a buried contact hole which exposes a predetermined portion of a surface of a semiconductor substrate underlying the inter-level insulating layer;

forming an amorphous polysilicon layer doped with a p-type impurity on the resultant structure to thereby fill the contact hole;

selectively etching the amorphous polysilicon layer to form a bottom electrode at a predetermined portion of the inter-level insulating layer which includes the contact hole; forming hemispherical grains (HSG) on an exposed surface of the bottom electrode; and subsequently doping the HSG with $PH_3$ under a temperature of less than 700° C. and a pressure of greater than 10 Torr;

wherein said forming the amorphous polysilicon layer comprises doping silicon with a p-type of impurity at a doping density of approximately $0.9 \times 10^{20} \sim 1.1 \times 10^{20}$ atoms/cm$^3$.

2. A method of fabricating an electrode of a capacitor of a semiconductor device, said method comprising:

forming an inter-level insulating layer having a buried contact hole which exposes a predetermined portion of a surface of a semiconductor substrate underlying the inter-level insulating layer;

forming an amorphous polysilicon layer doped with a p-type impurity on the resultant structure to thereby fill the contact hole;

selectively etching the amorphous polysilicon layer to form a bottom electrode at a predetermined portion of the inter-level insulating layer which includes the contact hole; forming hemispherical grains (HSG) on an exposed surface of the bottom electrode; and subsequently doping the HSG with $PH_3$ under a temperature of less than 700° C. and a pressure of greater than 10 Torr;

wherein the structure is not cleaned between said forming the HSG and said doping the HSG.

3. The method as claimed in claim 2, wherein the structure is not cleaned between said forming the HSG and said doping the HSG.

* * * * *